United States Patent [19]
Eikill et al.

[11] Patent Number: 5,274,648
[45] Date of Patent: Dec. 28, 1993

[54] MEMORY CARD RESIDENT DIAGNOSTIC TESTING

[75] Inventors: Richard G. Eikill, Rochester; Steven J. Finnes, Pine Island; Charles P. Geer, Rochester; Quentin G. Schmieser, Rochester, all of Minn.

[73] Assignee: International Business Machines Corporation, Armonk, N.Y.

[21] Appl. No.: 829,586

[22] Filed: Feb. 3, 1992

Related U.S. Application Data

[63] Continuation of Ser. No. 469,620, Jan. 24, 1990, abandoned.

[51] Int. Cl.$^5$ .................... G11C 29/00; G06F 11/22
[52] U.S. Cl. .................... 371/21.2; 395/575
[58] Field of Search .................... 371/22.3, 21.1, 21.2; 395/575

[56] References Cited
U.S. PATENT DOCUMENTS

| | | | |
|---|---|---|---|
| 4,342,084 | 7/1982 | Sager et al. ................ | 371/22.3 X |
| 4,597,042 | 6/1986 | d'Angeac et al. ........... | 364/200 |
| 4,667,330 | 5/1987 | Kumagai .................... | 371/71 |
| 4,710,931 | 12/1987 | Bellay et al. ............... | 371/22.3 |
| 4,757,503 | 7/1988 | Hayes et al. ................ | 371/21 |
| 4,782,486 | 11/1988 | Lipcon et al. .............. | 371/21 |
| 4,811,299 | 3/1989 | Miyazawa et al. .......... | 365/201 |

FOREIGN PATENT DOCUMENTS
292206 11/1988 European Pat. Off. .
8909471 10/1989 PCT Int'l Appl. .

OTHER PUBLICATIONS
Ayra, L., "A VHSIC ETM-Bus-Compatible Test and Maintenance Interface", Proc. 1987 International Test Conference, pp. 964–971.

Primary Examiner—Stephen M. Baker

[57] ABSTRACT

A data processing network includes multiple processing devices, multiple memory cards of main storage, and a main storage interface shared by the processors and memory cards. Each of the memory cards includes memory arrays, a hold register for retaining a data pattern stored to the arrays, a compare register and logic circuity. For a memory array diagnostic test, one of the processing devices sends a compare command (including address information) and the data pattern to one of the memory cards. In response, the logic circuity on the selected memory card stores the data pattern to its hold register and writes the data pattern into its memory arrays, then reads the data out of the memory arrays into its compare register. The contents of the compare and hold registers are compared, and an error indication provided to the processing device in the event that these registers' contents are not the same.

12 Claims, 2 Drawing Sheets

MEMORY CARD RESIDENT DIAGNOSTIC TESTING

This is a continuation of copending application Ser. No. 07/469,620, filed on Jan. 24, 1990, now abandoned.

BACKGROUND OF THE INVENTION

The present invention relates to information processing systems including multiple processing devices linked to multiple memory cards of a main storage memory through a shared interface, and more particularly to means for executing processor initiated diagnostic functions in the memory, while minimizing traffic on the interface.

In recent years, the performance of information processing devices has improved considerably, particularly in terms of more rapid processing of data. Information processing networks increasingly employ multiple processing devices sharing a common interface for transmitting data between the processors and main storage, which typically is composed of multiple memory cards. The current trend is toward larger main storage memories, employing greater numbers of such memory cards. Improvements in memory subsystems have not kept pace with improvements in processors. This is particularly evident when multiple, parallel processors are used in the network. Accordingly, system or network architectures have been modified to compensate for main storage memories which operate relatively slowly as compared to the processing devices. Cache memories and other techniques have been employed, in an attempt to uncouple the processors from the memory cards in main storage.

Whenever a computer system is powered on, the system is not immediately ready for use, but rather is subject to final preparation known as initial program load (IPL). This procedure involves installing initial programs into the system, as well as final testing of the system, including diagnostic testing of the memory arrays in main storage. The arrays are composed of individual memory locations or cells, each cell capable of storing a bit representing either a logical one or a logical zero. The diagnostic testing is intended to confirm that the cells are each capable of accurately storing logical ones and logical zeros, and that no pair of cells are shorted together.

In information processing networks utilizing multiple processors, and multiple memory cards comprising the main storage memory, the traditional approach to the memory diagnostic test is to utilize one or more of the processors to generate a predetermined data pattern and a data store command identifying a particular section of the memory arrays, and to provide these to main storage via the interface. The data pattern is written into the selected section of the memory arrays, and is later read back into the processor through a fetch command issued by the processor. The fetched data is compared to the original pattern to verify proper functioning of that section of the memory arrays.

Of course, all of the memory arrays must be tested, which consumes considerable time on the main storage interface and requires substantial processor overhead. In fact, memory diagnostic tests typically consume from ninety to ninety-five percent of IPL hardware test time. While this problem arises in part from the number of separate data patterns required to verify memory integrity, the principle factor is the processor and interface overhead involved in gaining access to the memory. This difficulty increases with the number of memory cards forming main storage, since a processor performing the tests must access the memory cards sequentially, without any overlap.

Among recent improvements in memory testing techniques are self testing memory devices. For example, U.S. Pat. No. 4,667,330 (Kumagai) discloses a self diagnostic circuit formed on the same chip as the memory arrays, for detecting defective cells. Data to be stored into the arrays also is provided to the self diagnostic circuit followed by a reading of the data out of the arrays, and a comparison with data in the diagnostic circuit In U.S. Pat. No. 4,757,503 (Hayes et. al.) a test generator, formed on a random access memory integrated circuit, produces a predetermined test pattern sequence applied to each of at least two storage arrays in the RAM. Data in each column of one of the storage arrays is compared with data in the equivalent column of the other storage array, with an error signal generated in case of any disagreement.

U.S. Pat. No. 4,782,486 (Lipcon et. al.) discloses a self testing memory in which test patterns are written simultaneously to all memory banks, by a central processing unit through a commonly shared memory control logic. Then, in connection with each memory board, the contents of a reference memory bank is compared with the contents of corresponding locations in the remaining memory banks.

While these approaches have proved satisfactory under certain conditions, they fail to address the need for rapid diagnostic testing of multiple memory cards in a network in which such memory cards interact with multiple processors through a shared interface. Moreover, they require either comparison of different arrays with one another, or logic on each chip, the cost of which can be prohibitive for multiple-chip memory cards.

Therefore, it is an object of the present invention to provide an information processing network in which a processing device can, through a shared interface, initiate overlapping or simultaneous diagnostic tests in multiple memory cards.

Another object of the invention is to reduce the time for manufacturing testing and initial program load testing of memory arrays, by reducing the number of times a processor (or a card tester) must gain access to the arrays in the course of such testing.

Yet another object is to provide an information processing network in which processor initiated diagnostic testing of memory arrays proceeds without delay or interruption due to traffic on the memory interface or asynchronous memory refresh operations.

SUMMARY OF THE INVENTION

To achieve these and other objects there is provided a process for diagnostic testing of memory arrays, performed in a data processing system that includes a processing device configuration for manipulating bit-encoded data, a memory having memory arrays for storing bit-encoded data, and an interface connected to the processing device configuration and to the memory, for transmitting the bit-encoded data between the processing device configuration and the memory. The process includes the following steps:

using the processing device configuration to generate a compare command for storing bit-encoded data and address information corresponding to a selected location in the memory arrays, and using the processing device configuration to generate a data pattern for subsequent storage in the selected location, transmitting the compare command, address information and data pattern to the memory via the interface;

responsive to the command and address information, storing the data pattern in a first register in the memory, writing the data pattern into the arrays at the selected location, reading data from the selected location into a second register in the memory, and comparing the data in the first and second registers.

If the data in the first and second registers is the same, the integrity of the arrays is verified. Differences between data in these registers causes the identification of an error.

Preferably, the data processing system includes multiple processing devices with the memory including multiple memory cards, with the processing devices and cards sharing a common main storage interface. At least one of the processing devices includes logic for generating "compare" commands and providing the compare commands to the memory cards via the interface for diagnostic testing of the memory cards, along with the usual processor logic for providing store commands to store data into the memory arrays, and fetch commands for retrieving data from the arrays.

Each of the memory cards includes a hold register for retaining a predetermined data pattern, supplied by the processing device along with the compare command. Further each memory card includes logic for writing the data pattern into designated locations in the memory arrays identified in the compare command. The data is then read out of the arrays into a read back register on the memory card, and the contents of the read back register are compared to the contents of the hold register. In the event of a disagreement, an error message is provided to the processing device via the interface.

As compared to the conventional approach of diagnostic testing governed by the processing devices, testing according to the present invention requires substantially less time. Performing diagnostic testing largely within main storage frees each processor to perform other tasks during virtually all of the time involved in memory array testing. Such other tasks can include initiating further diagnostic tests in connection with others of the multiple memory cards. The number of cycles required to test each memory location or cell is reduced, along with the time during which the interface between the processors and memory cards is occupied. Once each of the memory cards receives a compare command and accompanying data pattern, the card remains dedicated to completing the diagnostic test function, without interruption or other degradation from interface traffic or asynchronous memory refresh operations.

IN THE DRAWINGS

For a further appreciation of the above and other objects and advantages, reference is made to the following detailed description and to the drawings, in which.

DETAILED DESCRIPTION OF THE PREFERRED EMBODIMENT

Figure 1:
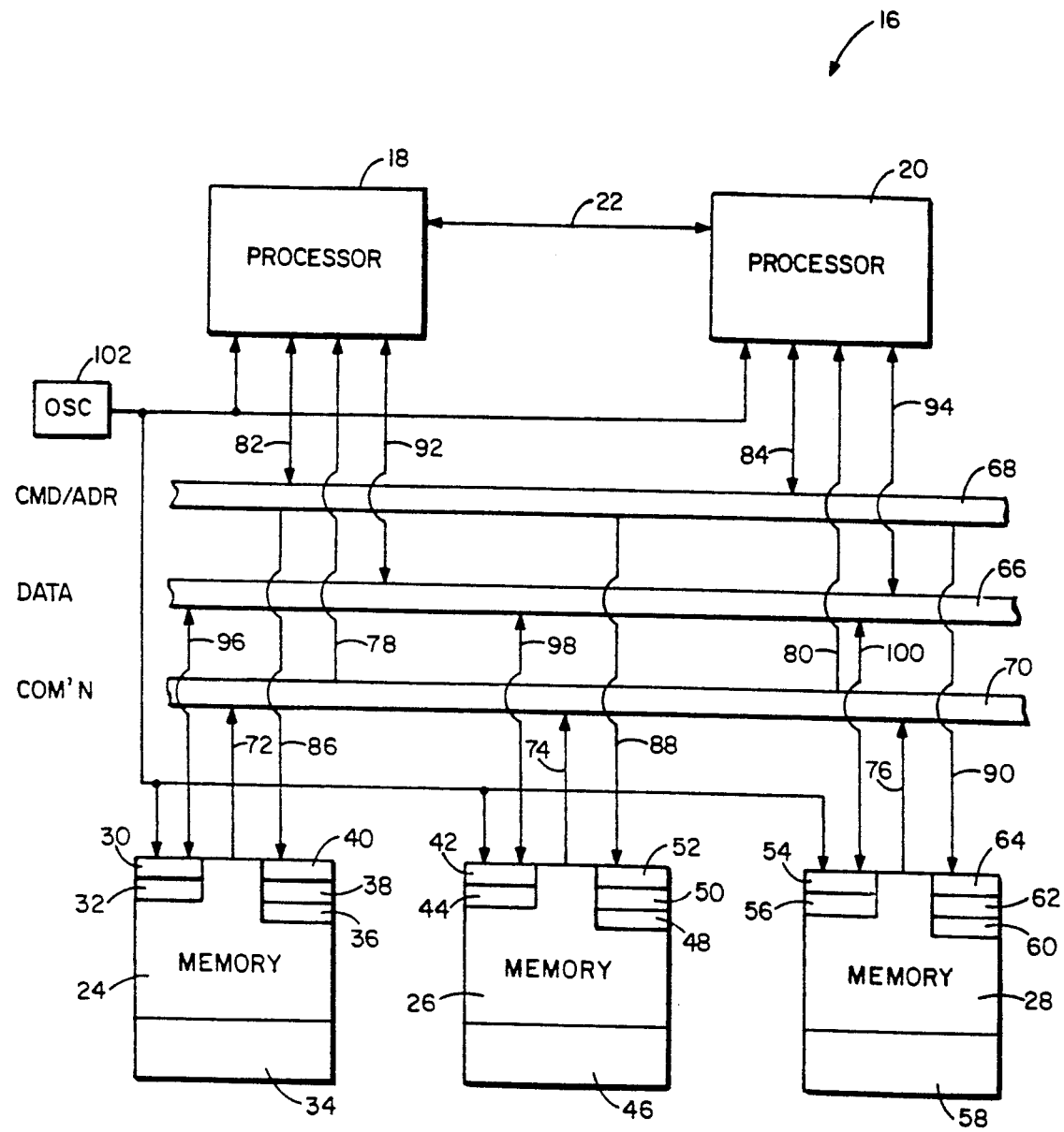
FIG. 1 is a schematic view of an information processing network in which multiple processing devices are associated with a main storage memory including multiple memory cards, through a shared interface.

Turning now to the drawings, there is shown in FIG. 1 an information processing network 16 for storing and performing selected operations upon bit-encoded data. The system includes two processing devices, identified at 18 and 20, each with circuitry for performing operations on data, and providing commands and related data for transfer to and from main storage. An arbitration link 22 joins the two processors, and is used in combination with arbitration logic residing in both processing devices to assign priority to either processor in terms of access to the interface. It is to be understood that the configuration of processing devices in this network could consist of a single processing device, or multiple processing devices in which multiple arbitration links are provided for a point-to-point connection of all processing devices.

An interface connects the processing devices with main storage, which includes multiple memory cards such as indicated at 24, 26 and 28. Memory card 24, for example, includes a buffer 30, a hold register 32, memory arrays 34 for storing bit-encoded data, a compare register 36, a status register 38 and logic circuitry 40 which includes a comparator circuit. Data stored in the memory arrays also is loaded into hold register 32 for later comparison with data read out of the arrays and into the compare register 36, using the comparator circuit.

Memory card 26 is similar to memory card 24, and includes a buffer 42, hold register 44, memory arrays 46, a compare register 48, a status register 50, and logic circuitry 52 including a comparator circuit. Likewise, memory card 28 includes a buffer 54, a hold register 56 memory arrays 58, a compare register 60, a status register 62 and logic circuitry 64. These components are substantially identical to and function in the same manner as their counterparts in memory card 24. It is to be understood that main storage can comprise any number of memory cards such as cards 24, 26 and 28.

The interface associating the processors and memory cards includes a data bus 66, a command/address bus 68 and a communication bus 70, each joined to all of the processing devices and memory cards, and transmitting data in parallel with the other buses. Data bus 66 transmits what can conveniently be called working information, i.e. information in which users of the system have the most direct interest. Command/address bus 68 transmits control information relating to commands to fetch, store or otherwise manipulate particular working data, and address information including a byte-aligned start address at which data is currently stored, or to which such data is to be stored, and the address length in terms of the number of bits involved.

Communication bus 70 is used to transmit status information from one of the memory cards to one of the processing devices while simultaneously transmitting working information to the processing device via the data bus. Bus 70 also is used by a memory card to notify a processing device that a memory card needs service, i.e. is subject to internal error, trap condition etc.

Communication lines 72, 74 and 76 enable the memory cards to transmit status information to communication bus 70 and then to the appropriate processing device via one of the communication lines 78 and 80. Status information is transmitted in only one direction, from one of the memory cards to one of the processing devices.

Command lines 82 and 84 transmit command and address information to bus 68, from which one of command lines 86, 88 and 90 forwards information to the appropriate memory card. Command transfers are unidirectional (from processor to a memory card), the arrows at both ends of command lines 82 and 84 indicating that each processing device, while transmitting a command, can inform the remaining processors as to the address and byte length of the access.

Data lines 92 and 94 between processors and bus 66, and data lines 96, 98 and 100 between the memory cards and the data bus, accommodate transmissions of working information in both directions. The interface includes further data paths not illustrated in FIG. 1, for controlling use of data bus 66. For a further explanation of the interface, reference is made to U.S. patent application Ser. No. 445,320, entitled "High Performance Shared Main Storage Interface", filed Dec. 4, 1989, and assigned to the assignee of the present application.

A clock oscillator 102 provides a timing signal to processing devices 18 and 20, and to memory cards 24, 26 and 28. The timing signal is comprised of individual timing pulses generated at a predetermined timing frequency, to provide uniform clock cycles.

When an information processing system is powered on, the hardware is tested and certain initial programs are loaded into the memory arrays, prior to any input from the prospective user. This procedure, known as initial program load (IPL), includes the diagnostic testing of memory arrays. To enhance user satisfaction, it is of course desirable to complete the initial program load in as short a time as possible, keeping in mind the need to test the hardware, including the memory arrays, sufficiently to verify their reliability. As previously mentioned diagnostic testing of the memory arrays requires up to ninety-five percent of the time involved in testing hardware. The current trend toward increased main storage memory, whether through additional memory cards, larger memory cards or both, underscores the need for an improved approach to testing the memory arrays.

In accordance with the present invention, memory array testing is accomplished more efficiently through shifting of certain control logic from the processing devices to the memory cards. The conventional processor-controlled approach to diagnostic testing is illustrated in the timing diagram of FIG. 2. A processor issues a store command during the first cycle, for transfer of a data pattern to a selected memory card during clock cycle 2. The data pattern is a predetermined series of logic ones and zeros, designed to test memory array integrity. The selected memory card begins to perform an access to its memory arrays in the second clock cycle. More particularly, access to the arrays is provided through two control lines, row address strobe (RAS) and column address strobe (CAS). The row address strobe initiates the data array access by going active at the beginning of the second clock cycle, while the column address strobe goes active at the beginning of the fourth clock cycle. Once CAS is active, the data pattern is written into the arrays at the selected location. The row address and column address strobes then go inactive.

Figure 2:
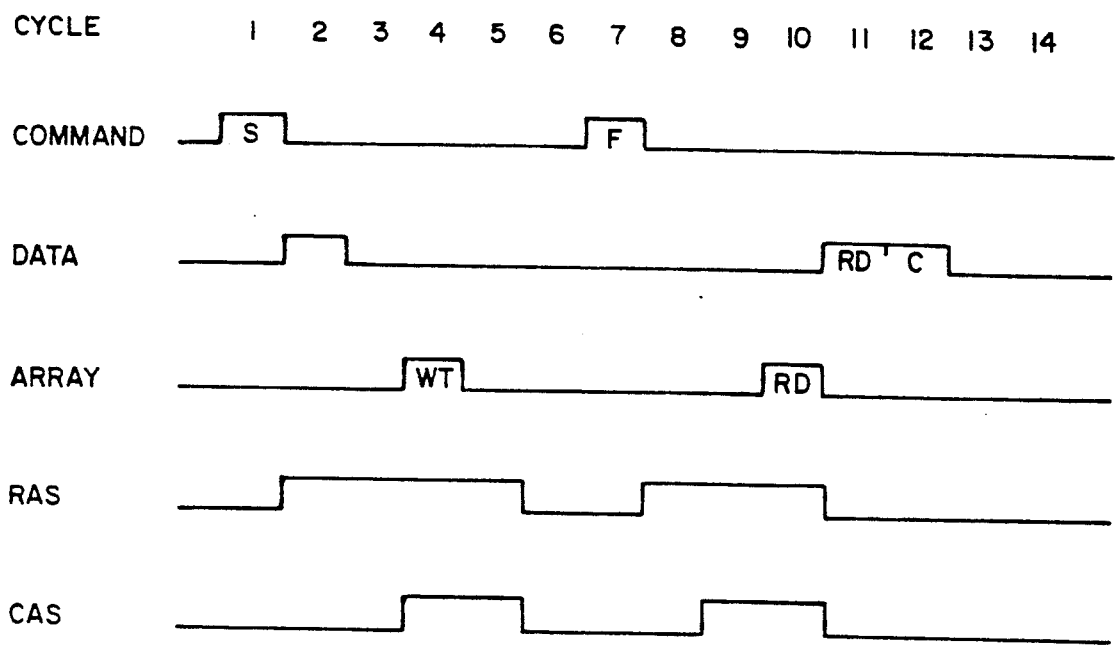
FIG. 2 is a timing diagram showing conventional testing of memory arrays during the initial program load.
Figure 3:
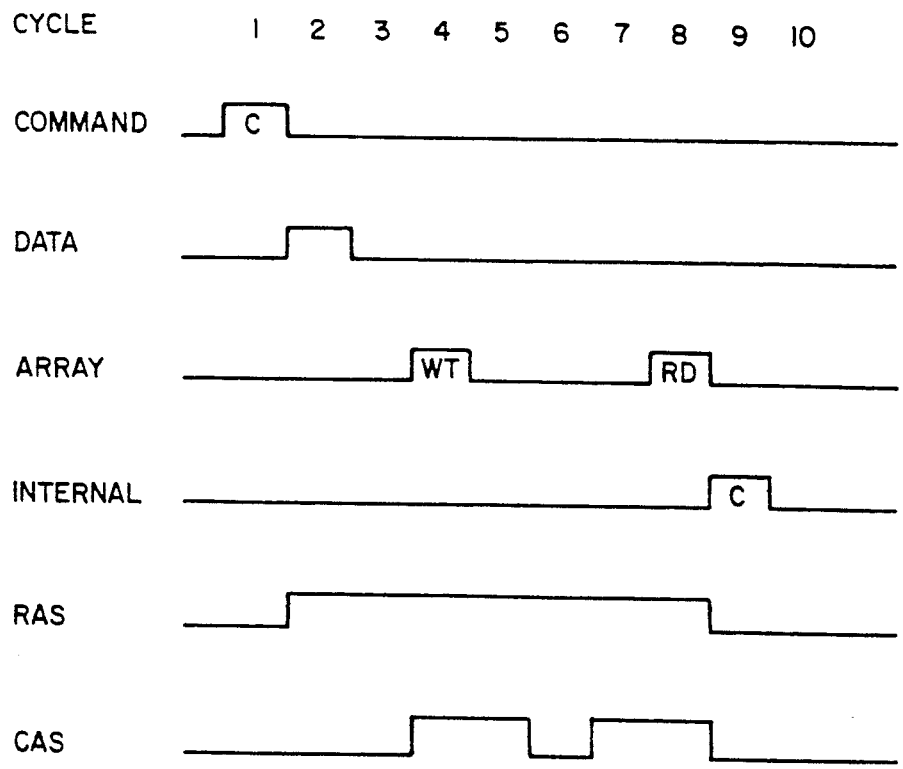
FIG. 3 is a timing diagram similar to that in FIG. 2, showing memory array testing in accordance with the present invention.

In connection with FIGS. 2 and 3, it should be noted that the RAS and CAS are shown going high as they go active, as a matter of consistency with other lines. In practice, RAS and CAS are "minus-active" i.e. going active as the level goes low.

In cycle 7, the processor issues a fetch command. The row address strobe and column address strobe go active again, in cycles 8 and 9, respectively. Data is read from the arrays during cycle 10, and transferred to the processor during cycle 11. Fetched data is compared with the original data during the twelfth clock cycle.

FIG. 3 illustrates diagnostic testing of memory arrays in accordance with the present invention. The initial steps (through clock cycle 5), when performed on one of memory cards 24, 26 and 28, are similar to the steps of the conventional approach, the key difference being that the processing device (e.g. processor 18) issues a compare command rather than a store command. As before, the data pattern is written to the memory arrays (e.g. memory arrays on card 34) to a selected location, during clock cycle 4. Further, however, the data pattern is written to hold register 32 during cycle 4. The data pattern is read back to the compare register 36 during the eighth clock cycle. In the next cycle, the contents of the compare register and hold register are compared in logic circuitry 40. If the comparison yields no differences in the contents of registers 32 and 36, the integrity of the arrays, as to the data pattern and the selected location, is verified. Conversely, responsive to a difference at any of the bit positions, an error condition is stored to status register 38, and an error message is provided to processor 18 via communication bus 70.

The timing diagram of FIG. 3 is based on the predetermined data pattern being written out to a single location in the memory arrays. In fact, the logic circuitry resident on each of the memory cards (at 40, 52 and 64 respectively) can cause the data pattern to be written simultaneously to multiple locations on multiple chips on its associated memory card, a feature which dramatically reduces the time necessary for memory array testing.

Thus, the circuitry resident on the memory cards slightly increases the speed of testing the memory arrays. Efficiency is increased beyond what this comparison would suggest, however, since the above examples assume that the processors in each case required no time in contending for use of the interface. In any configuration of multiple processors sharing a common interface in which multiple processors are employed in memory array diagnostic testing, each processor involved must contend with other processors for use of the main storage interface. The conventional test sequence (FIG. 2) requires the processor to gain access to the interface twice, once for storing the data pattern to the memory card, and once for fetching data from the arrays. Processor 18, by contrast, can test the arrays with only one access to the main storage interface.

This gives rise to another advantage, in that the diagnostic testing of memory arrays according to the invention requires only half the amount of interface use, specifically one cycle to provide the compare command, while the conventional sequence requires two clock cycles of interface usage. Once processing device 18, for example, has issued a compare command to one of the memory cards, the processor is freed for other activity including the providing of a compare command to one of the other memory cards. Consequently, multiple memory array tests of multiple memory cards can progress simultaneously.

Yet another advantage arises from the fact that the memory arrays are normally inactive, and require a predetermined number of clock cycles to become charged or ready for reading data from the memory arrays, or writing data into them. The number of cycles needed of course varies with the nature of the arrays and the cycle time, but in any case adds to the time required for an access to the arrays. The conventional test sequence requires access to the memory arrays first to store data to the memory arrays, and later, after the row address and column address strobes have become inactive, to fetch the data back from the arrays. By contrast, with the compare function performed on the memory card, there is no need to reactivate the row address strobe, which controls activation of the memory arrays.

Another advantage, again in contrast to the conventional sequence, is that asynchronous events such as memory refresh do not interfere with diagnostic testing of the memory cards. Such events can delay conventional tests, particularly if they occur between the store command and fetch command. Thus, an information processing network in accordance with the present invention, in which the memory cards of main storage test the memory arrays responsive to commands from the processing devices, reduces the time and interface usage required for tests.

What is claimed is:

1. A system for processing bit-encoded data including:
    a processing configuration including at least one processing device for manipulating bit-encoded data, a memory having memory arrays for storing bit-encoded data, and an interface connected to the processing configuration and to the memory for transmitting bit-encoded data between the processing configuration and the memory, said processing configuration including a means for generating a compare command and address data corresponding to a selected location in the memory arrays where data is to be stored;
    a means in the processing device configuration for generating a data pattern and for transmitting the data pattern to the memory via the interface; and
    a data manipulating means, within the memory, for verifying the integrity of the data pattern after the data pattern is stored to the memory arrays, said data manipulating means including:
    a first intermediate data retaining means receiving a data pattern from the processing configuration;
    a second intermediate data retaining means;
    said memory including a plurality of memory cards, each of the memory cards having data arrays, a hold register for receiving the data pattern from the at least one processing device, a compare register for receiving data read out of the memory arrays, and a comparator circuit for comparing the contents of the hold register and the compare register, said hold registers and compare registers providing, respectively, the first and second intermediate data retaining means;
    said interface including a data bus for transmitting the data pattern, and a command/address bus for transmitting the compare command and the address information, the data bus and the command/address bus being shared by the processing configuration and all of the memory cards; and
    a means, responsive to the compare command and the address data, for writing the data pattern in the first retaining means into a selected location of the memory arrays; then reading the data at the selected location into the second intermediate data receiving bit-encoded data from the at least one first and second intermediate data retaining means; and indicating an error to the processing configuration if the data in the second retaining means, all solely in response to receiving said compare command and while the memory remains capable of receiving bit-encoded data from the at lest one processing device and transmitting bit-encoded data to the at least one processing device via the interface.

2. The system of claim 1 wherein:
    each of said memory cards further includes a status register, said means responsive to the compare command indicating the error in the status register if the data in the hold register and the compare register are not identical.

3. The system of claim 2 wherein:
    said interface further includes a communication bus for transmitting an error indication in an associated one of the status registers, from the associated memory card to the processing configuration, said communication bus being shared by the processing configuration and all of the memory cards.

4. In a data processing system including at least one processor for manipulating bit-encoded data; a memory including a plurality of memory cards, each memory card having multiple memory arrays for storing bit-encoded data, a hold register for receiving the data pattern from the at least one processing device, a compare register for receiving data read out of the memory arrays, and a comparator circuit for comparing the contents of the hold register and the compare register; and an interface connected to the at least one processor and the memory for transmitting the bit-encoded data between the processor and memory, said interface including a data bus and a command/address bus, the data bus and the command/address bus being shared by the processing configuration and all of the memory cards; a process for testing the multiple memory arrays, including the steps of:
    (a) using the processor to generate a compare command and address information corresponding to a selected location in a first of the memory arrays, and further using the processor to generate a data pattern for storage at the selected location;
    (b) transmitting the command and address information, including a compare command, to the memory via the command/address bus;
    (c) transmitting the data pattern to the memory via the data bus;
    (d) solely responsive to receiving the compare command storing the data pattern to a first register in the memory, storing the data pattern to the first memory array at the selected location while retaining a record of the data pattern in the first register, reading data from the selected location into a second register in the memory subsequent to storing the data pattern to the first memory array, and comparing the data contained in the first register with the data contained in the second register;

(e) during the execution of at least a portion of step (d), performing at least one of steps (b) through (d) for another of the memory arrays and;

(f) maintaining said interface available for the transmission of bit-encoded data between the at least one processor and the memory while performing steps (d) and (e).

5. The process of claim 4 including the further step of:

after comparing the data, generating an error indication in the memory if the data contained in the second register is not identical to the data contained in the first register, and transmitting the error indication to the processor via the interface.

6. The process of claim 5 wherein:

said steps of storing the data pattern to the first register and to the arrays, reading the data into the second register, and comparing the data, are all performed with logic circuitry resident in the memory.

7. The process of claim 5 wherein:

said step of generating an error indication includes providing an error indication in a status register in the memory, and transmitting the error indication to the processor configuration via the interface.

8. In a data processing system including a plurality of processing devices, a memory comprising a plurality of memory cards, and an interface connected to the processing devices and to the memory for transmitting bit-encoded data between the processing devices and the memory, wherein each of the processing devices includes circuitry for manipulating bit-encoded data for performing operations on the bit-encoded data and further includes means for generating a data pattern and for transmitting the data pattern to the memory, wherein each of the memory cards includes a plurality of memory arrays for storing the bit-encoded data, and wherein the interface includes a data bus shared by all of the processing devices and all of the memory cards whereby bit-encoded data can be transmitted directly between any one of the processing devices and any one of the memory cards via the shared data bus, and further includes a command/address bus shared by all processing devices and all memory cards whereby the bit-encoded data can be transmitted directly between any one of the processing devices and any one of the memory cards via the shared command/address bus; a process for testing the memory arrays, including the steps of:

(a) using a processor to generate a compare command and address information corresponding to a selected location in a first of a memory arrays, and further using the processor to generate a data pattern for storage at the selected location;

(b) transmitting the command and address information to the memory via the shared command/address bus;

(c) transmitting the data pattern to the memory via the shared data bus;

(d) responsive to the command and address information, storing the data pattern to a first register in the memory, storing the data pattern to a first memory array at the selected location while retaining a record of the data pattern in the first register, reading the data from the selected location into a second register in the memory subsequent to storing the data pattern to the first memory array, and comparing the data contained in the first register with the data contained in the second register; and (e) during the execution of at least a portion step (d), performing at least one of steps (b) through (d) for another of the memory arrays.

9. The process of claim 8 wherein:

said interface further includes a communication bus shared by all of the processing devices and the memory cards whereby the bit-encoded data can be transmitted directly between any one of the processing devices and any one of the memory cards via the shared communication bus; including the further step of:

after comparing the data, generating an error indication in the memory if the data contained in the second register is not identical to the data contained in the first register, and transmitting the error indication to at least one of the processing devices via the shared communication bus.

10. A system for processing bit-encoded data including:

a processing configuration including a plurality of processing device for manipulating bit-encoded data, each of the processing devices including a means for generating a data pattern and a ;means for generating a compare command and address data corresponding to a selected location in the memory arrays where data is to be stored; a memory including a plurality of memory cards, each of the memory cards having data arrays for storing bit-encoded data, a hold register for receiving a data pattern from one of the processing devices, a compare register for receiving data read out of the memory arrays, and a comparator circuit for comparing the contents of the hold register and the compare register; and an interface connected to the processing configuration and to the memory for transmitting bit-encoded data between the processing configuration and the memory, wherein all of the processing devices and all of the memory cards share said interface; each of the processing devices including a means for transmitting a data pattern to the memory via the interface; and a data manipulating means, within the memory, for verifying the integrity of the data pattern after the data pattern is stored to the memory arrays, said data manipulating means including:

(i) a first intermediate data retaining means, comprised of said hold registers, for receiving a data pattern from the processing configuration;

(ii) a second intermediate data retaining means comprised of said compare registers; and (iii) a means, responsive to a compare command and address data, for writing the data pattern in the first intermediate data retaining means into a selected location of the memory arrays; then reading the data at the selected location into the second intermediate data retaining means; then comparing the data in the first and second intermediate data retaining means; and indicating an error to the processing configuration if the data in the second intermediate data retaining means is not identical to the data in the first intermediate data retaining means, all solely in response to receiving said compare command and while the memory remains capable of receiving bit-encoded data from the processing configuration and transmitting bit-encoded data to the processing configuration via the interface.

11. The system of claim 10 wherein:

said interface includes a data bus for transmitting the data pattern, and a command/address bus for transmitting the compare command and the address information, the data bus and the command/address bus being shared by all of the processing devices and all of the memory cards.

12. The system of claim 11 wherein:

said interface further includes a communication bus for transmitting an error indication in an associated one of the status registers, from the associated memory card to the processing configuration, said communication bus being shared by all of the processing devices and all of the memory cards.

* * * * *

UNITED STATES PATENT AND TRADEMARK OFFICE
CERTIFICATE OF CORRECTION

PATENT NO. : 5,274,648

DATED : December 28, 1993

INVENTOR(S) : Richard G. Eikill, Steven J. Finnes, Charles P. Geer, Quentin G. Schmierer.

It is certified that error appears in the above-identified patent and that said Letters Patent is hereby corrected as shown below:

Title page: Inventor Name "Schmieser" should be --Schmierer--.

Column 8, line 8, Delete "receiving bit-encoded data from the at least one".

Column 8, line 9, Delete "first and second intermediate data".

Column 8, line 9, after "means;" insert -- then comparing the data in the first and second intermediate data retaining means--.

Column 8, line 11, after "means" before the "," insert --is not identical to the data in the first retaining means--.

Column 8, line 14, "lest" should be --least--.

Column 10, line 21, "device" should be --devices--.

Column 10, line 23, Delete the ";" before "means" second occurrence.

Signed and Sealed this

Twenty-eight Day of February, 1995

*Attest:*

BRUCE LEHMAN

*Attesting Officer*    *Commissioner of Patents and Trademarks*